Dec. 5, 1961 E. W. HASSEL 3,012,208

KEYED OSCILLATOR WITH SPIKE INJECTING STARTING MEANS

Filed March 14, 1958

INVENTOR:
ELMER W. HASSEL,
BY Joseph P. Kates
HIS ATTORNEY.

United States Patent Office 3,012,208
Patented Dec. 5, 1961

3,012,208
KEYED OSCILLATOR WITH SPIKE INJECTING STARTING MEANS

Elmer W. Hassel, Fayetteville, N.Y., assignor to General Electric Company, a corporation of New York Filed Mar. 14, 1958, Ser. No. 721,467
9 Claims. (Cl. 331—153)

Figure 1:
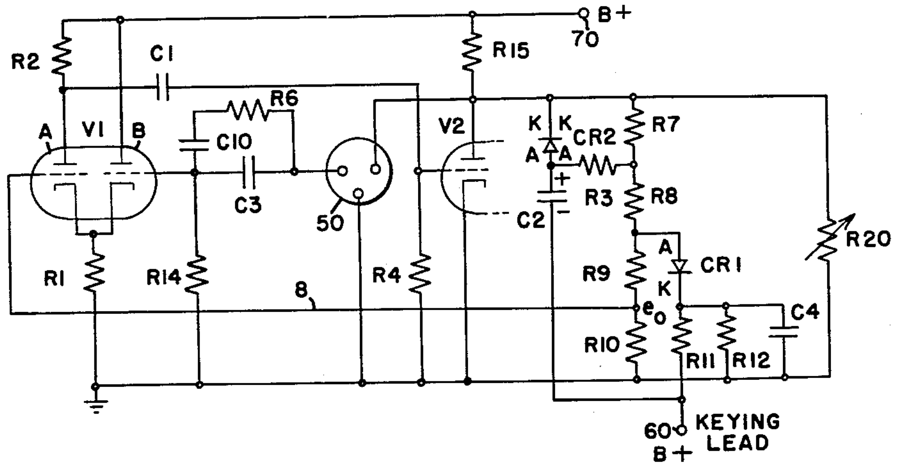

The present invention relates to an oscillator circuit and more particularly relates to fast-start audio-frequency oscillators wherein a method and means is presented of overcoming the long starting time inherent in stable oscillators having a high Q (narrow bandwidth or sharpness of resonance) at low frequencies. In the method of the present invention the means employed causes electrical shocking of a frequency selective circuit with a very narrow spike of energy of such nature as to start the circuit off at desired frequency and amplitude within time requirements which are very short. The characteristics of the spike should be such that it be a very small part of the electrical cycle of the continuous output wave of the oscillator of the order of about 10% or much less. Also, the spike should be limited in amplitude such that it will not over-stimulate the circuit. Over-stimulation results in excessive oscillator output amplitude during an interval of oscillation time. In addition, the spike-generating circuit must not interfere with the steady-state condition of the oscillator after the spike has performed its function.

The nature of the build-up time of a frequency discriminatory circuit is related to the bandwidth of that circuit. By permitting a wider bandwidth, a more rapid rise time will occur. A wider bandwidth, however, as related to the selective portion of an oscillator circuit, means degradation of oscillator performance in terms of stability. There is thus a compromise which must normally be made between frequency stability and starting time of an oscillator. This relationship becomes increasingly more difficult to compromise as the desired frequency becomes lower because the bandwidth may become an appreciable part of the operating frequency and stability requirements must be met.

Prior art oscillators which permitted of fast-start heretofore could only effectively be built with any appreciable degree of stability in the radio frequency (RF) ranges. Such prior art devices in the RF ranges accordingly with the wider bandwidth possible could be made to operate in a more rapid time, however, these wider bandwidths which permitted more rapid rise time caused degradation of oscillator stability. That is, prior art systems require a compromise between frequency stability and starting time which compromise cannot be effected in a low frequency oscillator because the bandwidth becomes an appreciable part of the operating frequency and stability requirements must be met.

The present invention overcomes these and other deficiencies of the prior art systems and methods and in addition provides a means for reducing the starting time of an audio-frequency oscillator. It is particularly applicable where keyed B+ techniques are employed to control the output. This occurs where control of an audio-frequency oscillator by means of the presence or absence of B+ is already provided as in two-way mobile radio service where the B+ may be already controlled in the exact time intervals at which the audio oscillator is to be controlled. In addition, the present invention improves the starting time of an oscillator in the audio frequency range which may enable an audio tone where used to control the squelch in a radio circuit to provide required speed of the order of 50 milliseconds or less at frequencies down to as low as 50 cycles per second (c.p.s.), the speed thus being comparable to the start time of a VHF transmitter. The present invention can also be advantageously used in a radio-telephone service such as where a Mobile Telephone Service (MTS) is combined with a Direct Dispatch Service (DDS). The present invention thereby provides a relatively simple circuit which by addition of a minimum number of relatively cheap components vastly improves the starting time of an audio frequency oscillator.

An object of the present invention is to provide an audio frequency oscillator capable of starting operation very rapidly.

Another purpose of the present invention is to provide a means and a method for reducing the starting time of an audio frequency oscillator wherein keyed B+ techniques are employed to control the output.

Another aim of the present invention is to provide a fast-start audio-frequency oscillator where it is desirable to control the oscillator by means of the presence or absence of B+ and which will be particularly adaptable to use in a two-way mobile radio service where the B+ is already controlled in the exact time intervals at which the audio oscillator is to be controlled.

Another object of the present invention is to provide a method and means for improving the starting time of an oscillator in the audio-frequency range in a system wherein the audio tone may be used to control the squelch in a radio receiver circuit and wherein required starting speed is of the order of 50 milliseconds or less at frequencies down to as low as 50 cycles per second and wherein the speed must be comparable to the start time of a very high frequency transmitter.

Another purpose of the present invention is to provide an oscillator in the audio frequency range capable of very fast starting and which will be feasible for use in conjunction with radio-telephone service equipment as, for example, where standard mobile telephone service is combined with direct dispatch service in both systems being used on the same RF channel and wherein if a mobile call originates from a mobile telephone service equipped mobile unit, no tone is used and a telephone operation is brought in but when a call originates from a direct dispatch service equipped mobile unit there must be tone on the air in sufficient time to operate a tone energized relay in a 100 milliseconds or less to avoid bringing in a telephone operator.

Another aim of the present invention is to provide a fast starting frequency discriminator circuit without requiring a wide bandwidth so that oscillator stability will be maintained and wherein compromise otherwise necessary between frequency stability and starting time of an oscillator is avoided.

Another object of the present invention is to provide a fast start audio oscillator of narror bandwidth wherein is avoided necessity for widening the bandwidth to an appreciable part of the operating frequency in order to meet stability requirements of the oscillator.

Another object of the present invention is to overcome the long build-up time ranging from approximately 200 to 800 milliseconds depending upon frequency and inherent in stable oscillators having a high Q at low frequencies by providing fast-start means for such an oscillator which means produces a spike of energy so that as the circuit starts out with high Q or narrow bandwidth before building up to a stable oscillating point, the circuit is shocked into oscillation very rapidly.

Another purpose of the present invention is to provide a method and a means for overcoming the long starting time inherent in stable oscillators having a high Q at low frequencies.

Another aim of the present invention is to provide a fast start circuit for an audio oscillator wherein a frequency selective circuit is electrically shocked with a very narrow spike of energy of such nature as to start the circuit off at the desired frequency and amplitude within a very fast time and wherein the characteristics required of the spike are that it be of duration covering a very small part of the electrical cycle of the continuous output wave of the oscillator and also that it be of such amplitude as not to over-stimulate the circuit which would otherwise result in an excessive oscillator output amplitude during the interval of time in question and wherein the spike generator circuitry must not interfere with the steady state condition of the oscillator after it has performed its function.

Figure 2:
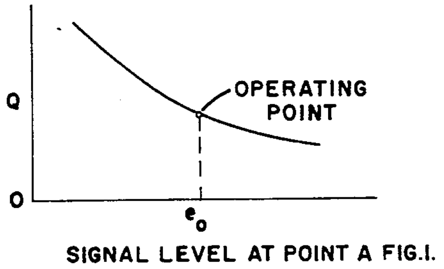
Figure 3A:
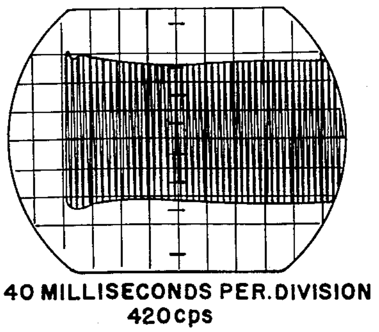
Figure 3B:
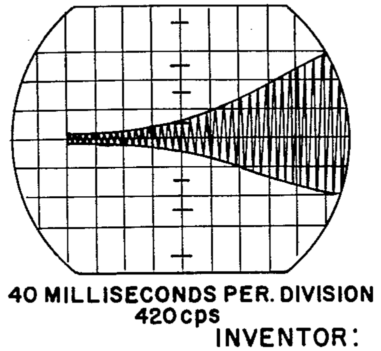

While the novel and distinctive features of the invention are particularly pointed out in the appended claims, a more expository treatment of the invention, in principle and in detail, together with additional objects and advantages thereof, is afforded by the following description and accompanying drawings in which:

FIG. 1 is a schematic representation of a preferred embodiment of the fast start audio oscillator circuit of the present invention;

FIG. 2 is a graphical representation showing the Q of the circuit as a function of signal level to show that when a circuit with a high Q or narrow bandwidth and without the inventive features of the present invention starts to build up to a stable operating point, the narrow bandwidth at the starting point, would except for the invention contribute to relatively long oscillator build up time (ranging from approximately 200 to 800 milliseconds depending upon the frequency); and FIG. 3 is graphical representation to show the effectiveness of the inventive circuit in providing fast-start time of an audio frequency oscillator circuit to come into oscillation in comparing FIG. 3A which shows the output waveform in a test of, for example, a tone transmitter incorporating the accelerated keying circuit of the present invention with FIG. 3B which shows the lack of effectiveness when the circuit of the present invention is omitted.

Referring briefly to FIG. 1, there is provided a first oscillator circuit including a first voltage keying circuit comprising capacitor C4, diode CR1, resistors R11 and R12 and a second circuit comprising diode CR2, resistor R3 and capacitor C2. In standby condition the oscillator feedback path is shorted out through the polarized diode CR1 and the capacitor C4 to ground. When the oscillator, including *only* the above enumerated *first* circuit is keyed by applying B+ to the keying lead 60, the voltage division between resistors R11 and R12 is such as to polarize the diode CR1 to the non-conducting state. The oscillator is then in a free-running condition and builds up slowly to its stable operating point.

Referring briefly to FIG. 2, the Q of the circuit without diode CR2, resistor R3 and capactor C2 can be seen to be a function of the signal operating level. The circuit starts out with a high Q or narrow bandwidth and slowly builds up to a stable operating point. This narrow bandwidth at the starting point contributes to a relatively long oscillator build-up time which may range from 200 to 800 milliseconds, depending upon the frequency. By addition of the circuit comprising capacitor C2, resistor R3 and diode CR2, the frequency selective circuit of FIG. 1 is electrically shocked with a very narrow spike of energy of a nature to start the circuit into oscillation at the desired frequency and amplitude within relatively close time requirements of the order of less than 100 milliseconds. By means of the inventive circuit the characteristic of the spike are caused to be such that it may be a very small part of the electrical cycle of the continuous output wave of the oscillator of FIG. 1 and also be of such amplitude so as not to over-stimulate the circuit which would otherwise result in excessive oscillator output amplitude during the interval of time in question. As will be explained hereinafter, the inventive circuit additionally satisfactorily provides the requirement imposed upon the spike-generating circuit of not interfering with the steady state condition of the oscillator after it has performed its function.

Expressed mathematically:

Let $\Delta f$ correspond to the bandwidth of the oscillator output, $f_o$=frequency of oscillator and $Q$=sharpness of resonance Then $$Q=\frac{f_o}{\Delta f}$$

and $$f_o=\Delta f\cdot Q$$

Then for stability when Q is very high, the $\Delta f$ must be small so that stability at the frequency of the oscillator will be achieved. Since the inertia of a high Q circuit is high the spike of energy must be applied to overcome this inertia and start the circuit into oscillation. However, it must not overstimulate the oscillator.

Referring to FIG. 1, in greater detail, diode CR2 may be in the absence of applied B+ at keying lead 60 biased in a non-conducting direction by a portion of the D.-C. voltage drop derived along the feedback circuit to feedback path 8. Resistor R3 may serve to polarize capacitor C2 and may also be of such magnitude as to isolate the feedback circuit from a keying source 60. When keying lead 60 is connected to B+ as shown in FIG. 1, capacitor C2 may increase its charge causing diode CR2 to conduct and insert a spike of energy into the oscillator circuit via the feedback path 8. As will be seen hereinbelow by adjusting the value of capacitor C2 the spike can be regulated so that its harmonics start the oscillator off in considerably less time than would occur if the oscillations were allowed to build up by themselves. Diode CR2 thus permits the insertion of starting energy to the oscillator and also effectively isolates the oscillator circuit after oscillations have been established.

In the illustrative embodiment shown, a duo triode vacuum tube V1 may be provided, each half of duo triode V1 comprising an anode, a control electrode and a cathode. The cathodes of tube V1 may be electrically connected together and a resistor R1 may be disposed between the junction of these cathodes and ground. Disposed between the anode of stage V1A of vacuum tube V1 and a source 70 of B+ may be an anode load resistor R2. Stage V1B of vacuum tube V1 may have its anode directly connected to the B+ source 70. A triode vacuum tube V2 may be provided and may have an anode, a cathode and a control electrode. A coupling capacitor C1 may be disposed between the anode of amplifier stage V1A and the control electrode of stage V2. An anode load resistor R15 may be disposed between the B+ voltage source 70 and the anode of vacuum tube V2. The cathode of tube V2 may be grounded. Disposed between the control electrode of stage V2 and ground may be a grid resistor R4. Disposed between the anode of stage V2 and the control electrode of cathode follower stage V1B may be a feedback path circuit or loop comprising a conventional twin T network 50 to present a very high impedance at a particular predetermined frequency. Disposed between the T network 50 and the control electrode of stage V1B may be a capacitor C3. In parallel with capacitor C3 may be a series circuit including a resistor R6 having one end connected to network 50 and a capacitor C10 having one end connected to the control electrode of stage V1B. Inasmuch as the above-described circuit can conventionally provide oscillations which will appear at the anode of stage V2, the circuit operation will not be described in detail, however, briefly considering stage V1A as an amplifier coupling output through capacitor C1, stage V2 will be responsive to an A.-C. signal received from stage V1A and will at the frequency corresponding to the frequency response of twin T element 50 couple back a regenerative feedback voltage to the control electrode of cathode follower V1B. As shown, output is not taken from the cathode follower stage V1B. If a feedback path is provided to stage V1A from the output of stage V2 regenerative feedback will occur and oscillations will result.

Disposed between the anode of stage V2 and ground may be a voltage divider network comprising resistors R7, R8, R9 and R10 respectively in series. To the junction between resistors R8 and R9 may be connected the anode of a diode CR1. The cathode of diode CR1 may be connected to one end of a resistor R11, the opposite end of resistor R11 being connected to a keying lead 60 (provided with continuous B+ on keying) for a purpose which will be described. Disposed at the junction between the cathode of diode CR1 and resistor R11 may be one end of a second resistor R12 and one end of a capacitor C4, the other end of capacitor C4 and resistor R12 being connected to ground. Resistor R11 and resistor R12 are therefore in series from the keying lead 60 to ground and form a voltage divider network to provide proper voltage at the cathode of diode CR1 for a purpose which will be described. Capacitor C4 may provide tone A.-C. bypass, for example. Also disposed between the anode of stage V2 and ground may be a variable resistor R20 to provide automatic gain control. Resistor R12 may be a tube of the type known as a varistor produced by the General Electric Company under the trademark "Thyrite." The cathode of a second diode CR2 (which may be a crystal diode) may be connected to the anode of stage V2. Between the junction of resistors R7 and R8 of the voltage divider comprising resistors R7, R8, R9 and R10 may be disposed one end of a resistor R3, the other end of resistor R3 being connected to the anode of diode CR2. Connected to the keying lead 60 on one plate and having the other plate tied to the junction between resistor R3 and the anode or plate of diode CR2 may be a capacitor C2. Taking the function of starting oscillation without the components comprising crystal CR2, resistor R3 and capacitor C2; upon initiation of a plus voltage at the keying lead, diode CR1 will be reversely biased (its anode will be lower in voltage potential than its cathode) and the short circuit path therethrough will become an open circuit. Thus, the flow of electron current will occur from ground through the complete voltage divider network R10, R9, R8 and R7 and through R15 to B+. Normally, however, without B+ being applied at the keying lead 60 the oscillator will be prevented from operation because of the comparative short circuit through crystal diode CR1, the path through resistor R12 and capacitor C4 which will be the preferential current path rather than the relatively large impedance presented by the path through resistors R9 and R10. Therefore, with diode CR1 and capacitor C4 in the circuit, feedback through path 8 of regenerative energy to stage V1A will be prevented and oscillation will not take place. On applying B+ at the keying lead 60, because of the voltage drop through resistors R15, R7 and R8 the polarity of the diode CR1 will be reversed, its cathode then being at a relatively larger positive potential than its anode. This will cut off diode CR1 and cause electron current to then flow through resistors R10 and R9 to thus provide a feedback voltage through feedback path or line 8 to cause oscillation to take place. However, because of the circuit time constants involved the period required for starting oscillation is too slow to perform functions as rapidly as desired for purposes as in the mobile radio field. With the additional circuit provided by diode CR2 and capacitor C2, upon application of B+ at the keying lead 60, capacitor C2 which may be a very small capacitor of the order of a couple of hundred micro-microfarads will charge up through the relatively low resistance path of diode CR2. The low resistance path of diode CR2 is caused by the fact that the positive voltage at the keying lead 60 applied through capacitor C2 is higher than the B+ voltage at the cathode of diode CR2 because of the voltage drop through anode load resistor R15 at the anode of stage V2. The charging current flowing through capacitor C2 and diode CR2 provides the necessary energy to quickly start the oscillator. A spike of energy is created which is very small in duration compared to the period of the sine wave or time for one cycle at the frequency of operation of the oscillator (could be of the order of 10% or much less). This spike which is positive going is fed through dropping resistors R7, R8 and R9 and through lead 8 back to the grid of tube V1A. Since this spike must be very small in time duration, capacitor C2 is preferably very small in capacitance value. When capacitor C2 is charged, current will cease to flow through diode CR2. As capacitor C2 charges the potential (polarity) across diode CR2 reverses, thus, cutting off the duration of the spike. Resistor R3 tapped between resistor R7 and resistor R8 provides a reference voltage at the anode of diode CR2. The purpose of resistor R3 is to supply a polarizing voltage to diode CR2.

An important feature of the present invention is to remove the effects on oscillation once it has started which effects might come from not correctly incorporating capacitor C2, resistor R3 and diode CR2 after its function of providing a fast starting condition for the oscillator (shocking) has been completed.

As hereinbefore stated once the spike of energy has been generated and introduced into the remainder of the circuit such that feedback of the spike along line 8 has caused the oscillator to come rapidly into oscillation, capacitor C2 which was charging, will continue charging. On the continuing charge cycle of capacitor C2 a stable state condition will occur when the potential of the upper plate of capacitor C2 adjacent the anode of diode CR2 equals the potential existing at the junction between resistors R7 and R8 so that no further current flow occurs across resistor R3. With substantially no current flow through resistor R3, resistor R3 provides a relatively high impedance such that the signal at the junction point between resistors R7 and R8 is not bypassed across resistor R3 and through capacitor C2 to ground. The only other possible path for leakage of the oscillator signal could be across diode CR2. However, in this condition the polarity of diode CR2 is such that it presents a very high impedance to the passage of the signal therethrough because it is back-biased at this point and current cannot flow from its anode to its cathode appreciably. That is, the potential at the anode of stage V2 and hence at the cathode of diode CR2 during this condition will be higher than the potential at the anode of diode CR2. It should be understood that the values of resistors R7 and R8 and the remaining resistance values in the voltage divider circuit of resistors R7, R8, R9 and R10 are chosen such that the voltage across resistor R7 will never exceed or equal the peak inverse voltage rating of diode CR2. Resistor R7 must therefore be carefully chosen to be small enough so that a voltage developed across it will not exceed this peak inverse voltage. In the quiescent condition (no keying B+ applied) the lower plate of capacitor C2 will be essentially grounded since B+ is no longer being fed through the keying lead, the grounding occurring through resistors R11 and R12. It should be understood that capacitor C2 remains charged even after it has performed its function because the B+ at the keying lead remains applied during the complete duration of a voice conversation. However, upon cessation of the conversation, a discharge path for capacitor C2 is provided from its lower plate to the keying lead 60 and through resistors R11 and R12 to ground. Thus, because capacitor C2 remains charged throughout the conversation, resistor R3, diode CR2 and capacitor C2 will effectively remain out of the circuit once the spike of energy has been introduced and will not affect oscillations from the oscillator. After conversation or operation has ceased as stated, the discharge path of capacitor C2 will be through resistors R11 and R12 to ground.

Because of the above action whereinafter conversation has ceased, capacitor C2 is then permitted to discharge so that the circuit is ready for operation once again should a new conversation ensue, an automatic reset feature is thus provided such that capacitor C2 upon the new conversation taking place may be permitted to charge up to once again momentarily introduce the relatively short spike of energy to cause the oscillator to go into oscillation in a comparatively fast time.

Referring to FIGS. 3A and 3B the very substantial beneficial effect of the inventive device and method is pictorially represented. As can be seen therein the oscillator comes to a very quick start with incorporation of the inventive features.

Thus, it is seen that a fast start audio oscillator is provided wherein a spike of energy shocks the circuit into oscillation with the right amount of duration and amplitude of excitement but which does not adversely affect oscillator frequency and wherein the effects of the means to provide the spike of energy are neutralized after shocking and wherein an automatic reset feature is provided and also wherein peak inverse ratings of diode components is not exceeded.

Although in nowise to be construed as limiting the scope of the present invention, the following table of values presents one suggested embodiment illustrating a successful operation of the circuit of FIG. 1.

| Part: | | Value |
|---|---|---|
| C1 | μf | .001 |
| C2 | μμf | 220 |
| C3 | μf | .001 |
| C4 | μf | .001 |
| C10 | μf | .01 |
| R1 | | 2700Ω |
| R2 | | 560K |
| R3 | | 390K |
| R6 | megΩ | 8.2 |
| R7 | | 62K |
| R8 | | 130K |
| R9 | | 15K |
| R10 | Ω(C3R77P9J) | 910 |
| R11 | | 820K |
| R12 | | 68K |
| R14 | megΩ | 2.2 |
| R15 | | 39K |
| R20 | | 100K |

| Tube: | Designation |
|---|---|
| V1 | 12AX7 or 6681 |
| V2 | 12AT7 or 6679 |

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. An audio oscillator comprising a first amplifier and a cathode follower having a common cathode, a second amplifier responsive to output from said first amplifier and means to feed energy from the output of said second amplifier to said cathode follower to thereby provide for oscillations, a voltage divider comprising a first, a second and third resistance portions disposed across said second amplifier, a diode and a fourth resistor in series disposed across said first resistor, a B+ keying source, means to provide oscillation after a relatively long period of time, a capacitor disposed between said diode and said keying source, said capacitor being charged on application of keying source B+, the polarity of said diode being such as to provide current flow through said diode on application of said keying B+ to thereby provide a spike of energy, said energy feedback means being connected to said voltage divider, said spike of energy thereby being fed back to shock said oscillator into oscillation on initial conduction of said diode.

2. The apparatus of claim 1 wherein said capacitor is of value taken in conjunction with said fourth resistor thereto to provide a relatively short time constant relative to the time to start oscillation from said means to provide oscillation after a relatively long period of time.

3. In an audio oscillator, means to effect substantial advance in the time necessary to start oscillators, said means comprising means to generate and inject a narrow spike of energy of limited amplitude into the feedback loop of said oscillator, means to cut off the effect of said spike generating means, means to reset said spike generating means for subsequent operation, said means to generate said spike comprising a diode, a capacitor and a resistor and said means to cut off the effect of said spike generating means including switching means to reverse polarity of said diode.

4. The means of claim 3 including means to charge said capacitor for the duration of the spike and during further operation of said oscillator and wherein said reset means includes grounding means to discharge said capacitor after oscillations of said oscillator has stopped.

5. In an oscillator comprising an amplifier circuit and a feedback path from the output of said amplifier to its input to provide sustained oscillations, a voltage divider network disposed across the output of said oscillator, a lead source of keying B+, a diode and a resistor in series connected along the voltage divider network with the diode cathode being connected to the B+ source and the diode anode being connected to a point along the voltage divider, a first bypass capacitor disposed between the anode of said diode and ground, a second diode having its cathode connected to the oscillator output and a second capacitor connected to the anode of said second diode at one end and connected to the keying lead at the other end thereof, a resistor disposed between the junction of said second diode and said second capacitor and a point along the voltage divider network, an oscillator B+ source, said feedback path being provided between the keying and oscillator B+ source, and removed from the junction of said first anode and said voltage divider network so that upon applying B+ at said keying lead a spike of energy is developed by said second diode and said second capacitor to thereby cause rapid feedback to the input of said oscillator to accelerate oscillation of the oscillator.

6. In an oscillator comprising an amplifier having an input and an output circuit, a voltage divider network disposed across said output of said amplifier, and feedback means to provide feedback from said voltage divider network to the input of said amplifier in normal stable operating condition of said oscillator, means to provide B+ at continuous intervals to a point along said voltage divider network, means including a diode and a capacitor to provide a spike of energy for application to said feedback means to cause rapid start of oscillation in said oscillator upon application of B+, and means to reverse polarity of said diode upon termination of said energy spike.

7. In an oscillator comprising an amplifier, a cathode follower and an output stage, a voltage divider network disposed between the output point of said output stage and ground, said voltage divider comprising first, second, third and fourth resistors, a B+ source, a fifth resistor disposed between said B+ source and the output point, a B+ keying lead, a first diode and a sixth resistor disposed between the junction of said second and third resistors and the B+ keying lead, the anode of the first diode being connected to the second and third resistor junction point, a seventh resistor and a first capacitor each connected between the cathode of said first diode and ground and a feedback line between the third and fourth resistors and the control electrode of said amplifier, apparatus for rapidly causing stable oscillation of the oscillator comprising a second diode and an eighth resistor connected across said first resistor, the second diode cathode being connected to said output point, a capacitor of relatively small capacitance disposed between said second diode anode and said B+ keying lead, said first resistor being of value so as not to exceed the peak inverse voltage rating of said second diode, so that on application of B+ at said keying lead said first diode polarity will reverse to cut off said first diode and said small capacitor will charge up to create a spike of feedback energy to shock said oscillator into oscillation, continued charging of said capacitor causing polarity of said second diode to reverse to abruptly cut off conduction through said second diode, said small capacitor, said eighth resistor and said second diode thereby being isolated from affecting the remainder of the circuit after the spike has been generated, removal of B+ from said keying lead causing said second capacitor to discharge to provide a reset feature for the next operation of said keying lead.

8. In a keyed oscillator the combination comprising oscillator means having input and output cricuits, an energy feedback path between said output and said input circuit, circuit means connected in the feedback path for bypassing said feedback path and thereby preventing oscillation, means responsive to a keying action for enabling said feedback path to permit feedback of energy and to condition said oscillator for operation, and further circuit means for simultaneously producing a sharp increase in feedback energy in response to said keying action and injecting it into said feedback path, and means for terminating said increase in said feedback energy.

9. In a keyed oscillator circuit the combination comprising oscillator means having input and output circuits and an energy feedback path between said input and output circuits, a polarity sensitive conductive path coupled across a portion of the feedback path for bypassing said feedback path and thereby preventing oscillation, means for applying a keying signal of the proper polarity to said conductive path to change the conductivity thereof and thereby enable said feedback path to initiate oscillation, and further means responsive to said keying signal for simultaneously producing a sharp rise in feedback energy of short duration to provide fast buildup of oscillation.

References Cited in the file of this patent

UNITED STATES PATENTS

| | | |
|---|---|---|
| 2,140,267 | Markowitz | Dec. 13, 1938 |
| 2,416,368 | Young | Feb. 25, 1947 |
| 2,426,021 | Hausz et al. | Aug. 19, 1947 |
| 2,454,845 | Sherman et al. | Nov. 30, 1948 |
| 2,462,872 | Klemperer | Mar. 1, 1949 |
| 2,610,294 | Seddon | Sept. 9, 1952 |